United States Patent [19]
Tateishi et al.

[11] Patent Number: 6,097,777
[45] Date of Patent: Aug. 1, 2000

[54] PHASE LOCKED LOOP CIRCUIT

[75] Inventors: Kiyoshi Tateishi; Kazuo Takahashi, both of Tsurugashima, Japan

[73] Assignee: Pioneer Electronic Corporation, Tokyo, Japan

[21] Appl. No.: 08/879,972

[22] Filed: Jun. 20, 1997

[30] Foreign Application Priority Data

Sep. 20, 1996 [JP] Japan ................................. 8-249636

[51] Int. Cl.$^7$ ...................................................... H03D 3/24
[52] U.S. Cl. ........................... 375/376; 375/371; 331/17; 331/1 A
[58] Field of Search ..................................... 375/376, 371; 331/17, 1 A; 269/275.3; 348/542

[56] References Cited

U.S. PATENT DOCUMENTS

| | | | |
|---|---|---|---|
| 4,404,530 | 9/1983 | Stryer | 331/1 A |
| 4,928,075 | 5/1990 | Leis | 331/17 |
| 4,942,370 | 7/1990 | Shigemory | 331/1 A |
| 4,996,596 | 2/1991 | Hirao et al. | 348/542 |
| 5,528,198 | 6/1996 | Baba et al. | 331/1 A |
| 5,848,051 | 12/1998 | Ishizawa et al. | 369/275.3 |

*Primary Examiner*—Stephen Chin
*Assistant Examiner*—Shuwang Liu
*Attorney, Agent, or Firm*—Evenson, McKeown, Edwards & Lenahan, P.L.L.C.

[57] ABSTRACT

The present invention is intended to reliably achieve a locked PLL even with a short VFO field to correctly perform subsequent reproduction of information data. A PLL circuit of the present invention is supplied with a composite signal composed of a repetitive signal including a pulse train of a constant duty ratio and a random signal including a pulse train allowing variations in duty ratio, where the two signals are arranged in time series. The circuit is provided with a VCO for generating an output signal having a frequency according to a control signal, a PFC for comparing the repetitive signal with the output signal in terms of phase and frequency to generate a phase frequency error signal, a PC for comparing the random signal with the output signal to generate a phase error signal, and loop filters for extracting predetermined band components of the phase frequency error signal and the phase error signal to generate the control signal. Since a PLL is formed including the phase frequency comparator, which has a wide dynamic range and operates at a single lock point, during reading a VFO, a reliable drawing operation is achieved even with a short VFO without miss lock.

8 Claims, 6 Drawing Sheets

PHASE LOCKED LOOP CIRCUIT

BACKGROUND OF THE INVENTION

1. Field of the Invention

The present invention relates generally to a phase locked loop (PLL) circuit, and more particularly to a PLL circuit which is suitable for use in reproduction of a signal recorded on a disc-shaped recording medium.

2. Description of the Related Art

In techniques for reading data on a disc as a recording medium while rotating the disc, preformat data called "VFO" (Variable Frequency Oscillator) or "VFO-SYNC" (Variable Frequency Oscillator-Synchronization) has been conventionally used as a sequential repetitive data pattern for ensuring the reproduction of data recorded on the disc even if the rotation of the disc varies. The VFO is recorded on the disc together with main information data in a predetermined format. During a reading operation, in turn, a PLL provided in a reading system generates a clock signal to lock the PLL to the VFO data pattern, the clock signal being used for reproducing the information data.

With the foregoing configuration, since variations in the rotation of the disc causes simultaneous variations in a data waveform of the VFO data, the PLL is locked (or followed) to such a read data waveform susceptible to variations to thereby generate a suitable clock for the reproduction of similarly variable information data.

At present, a high density recording disc called "Digital Video Disc" (hereinafter called the "DVD") has been brought into a practical use. There are a variety of recording forms and reading forms for the DVD, one of which is a type called "DVD-RAM" (DVD-Random Access Memory).

An attempt has been made to apply the aforementioned information reproducing techniques using the VFO also to such DVD-RAM. However, the DVD-RAM employs a format which has a quite limited VFO field on the disc, in other words, uses a very short VFO data pattern, because this is redundant data, to increasing an area for recording essential information data so that high density recording is achieved. A PLL provided in a reading system, which is for reproducing a clock, must lock to the VFO data within the VFO field in a read signal. If the lock of the PLL to the VFO data cannot be carried out within the VFO field, incomplete reproduction of the information data will result. Thus, if the VFO data pattern is too short, it is more difficult to lock the PLL to the VFO data pattern, thereby causing possible deterioration in information reproducing performance.

OBJECT AND SUMMARY OF THE INVENTION

The present invention has been made in view of the problem mentioned above, and its object is to provide a PLL circuit which is capable of reliably achieving the PLL lock even with a short VFO field, thereby correctly performing subsequent reproduction of information data.

A PLL circuit according to a first aspect of the present invention is supplied with a composite signal composed of a repetitive signal including a pulse train of a substantially constant duty ratio and a random signal including a pulse train having a format allowing variations in duty ratio, arranged essentially in time series, and is characterized by comprising variable oscillating means for generating an output signal having a frequency according to a control signal; phase frequency comparing means for comparing the repetitive signal with the output signal in terms of phase and frequency to generate a phase frequency error signal; phase comparing means for comparing the random signal with the output signal in terms of phase to generate a phase error signal; and loop filter means for extracting predetermined band components from the phase frequency error signal and the phase error signal to generate the control signal.

A PLL circuit according to a second aspect of the present invention is supplied with a composite signal composed of a repetitive signal including a pulse train of a substantially constant duty ratio and a random signal including a pulse train having a format allowing variations in duty ratio, arranged essentially in time series, and is characterized by comprising variable oscillating means for generating an output signal having a frequency according to a control signal; phase frequency comparing means for comparing the composite signal with the output signal in terms of phase and frequency to generate a phase frequency error signal; phase comparing means for comparing the composite signal with the output signal in terms of phase to generate a phase error signal; loop filter means for extracting predetermined band components from the phase frequency error signal or the phase error signal to generate the control signal; and control means for forming a first phase synchronization loop including the phase frequency comparing means substantially in response to the repetitive signal produced from the composite signal, and for forming a second phase synchronization loop including the phase comparing means substantially in response to the random signal produced from the composite signal.

DESCRIPTION OF THE PREFERRED EMBODIMENTS

Figure 1:
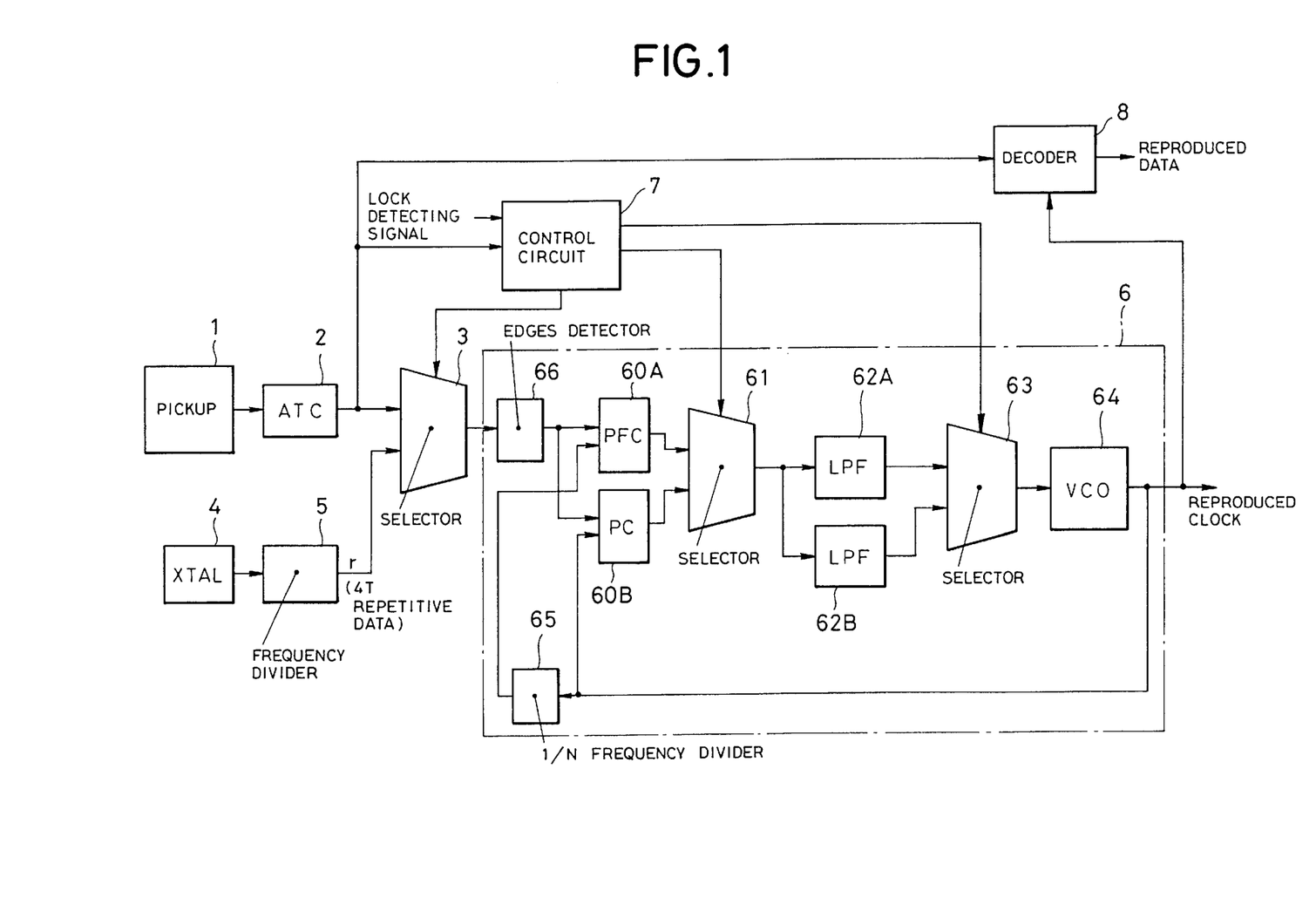
FIG. 1 is a block diagram partially illustrating a schematic configuration of a disc player to which a PLL circuit of an embodiment according to the present invention is applied.

An embodiment of the present invention will hereinafter be described in detail with reference to the accompanying drawings. FIG. 1 illustrates a general configuration of a portion of a disc player to which a PLL circuit of an embodiment according to the present invention is applied.

Referring specifically to FIG. 1, a pickup 1 optically reads a DVD-RAM type disc (not shown) being rotated, and supplies an ATC circuit 2 with an electrical analog read signal produced through an opto-electrical transducing operation. The ATC circuit 2, which performs an automatic threshold control, digitizes the read signal supplied thereto with a controlled threshold value, and supplies the digitized signal to one input of a selector 3. The selector 3 is also supplied at the other input with an output signal of a quartz oscillator 4, serving as a local oscillator means, through a frequency demultiplier or divider 5 as a reference signal or a reference frequency signal r. The selector 3 supplies a PLL circuit 6 with one of the input signals in accordance with a control signal, later described.

The PLL circuit 6 has a parallel arrangement of a phase frequency comparator (PFC) 60A as a first phase comparing means and a phase comparator (PC) 60B as a second phase comparing means. An output signal from the selector 3 is input to a both edges detector 66 which detects both rising and falling edges of the output signal and converts the output signal into a signal having a pulse wave corresponding to detected edges. Thus, delivered from the output of the both edges detector 66 is a multiple signal having edges twice as much as the input signal. The multiple signal is supplied to one input of the phase frequency comparator 60A and to one input of the phase comparator 60B. The phase frequency comparator 60A is also supplied at the other input terminal with a signal produced by dividing or demultiplying in frequency an output signal of the PLL circuit 6 by N (N is a real number equal to or more than one) by a frequency divider 65, while the phase comparator 60B is directly supplied at the other input with the output signal of the PLL circuit 6.

The phase frequency comparator 60A has a linear phase comparison characteristic essentially identical to that of general phase comparators in a synchronized state where the frequencies of the two inputs are close to each other, and generates an output signal having a value in accordance with the difference in phase between the two inputs. On the other hand, the phase frequency comparator 60A has a function of detecting a frequency difference in an out-of-synchronization state where the frequencies of the two inputs are largely different from each other, and can generate an output having a large value in accordance with the difference in frequency between the two inputs to expand a frequency drawing region or pull-in range to a synchronization holding region or hold-in range (that is, the PLL circuit 6 can be reliably locked even with a large frequency difference). Thus, this type of comparator is not suitable for a so-called random data input which presents irregular changes in phase irrespective of the frequency and has an ever-changing duty ratio of input pulses, but is suitable for a so-called repetitive data input which presents regular changes in phase in relation to the frequency and always has substantially a constant duty ratio of input pulses. Since a variety of such comparators have been known with respect to the configuration and techniques thereof, specific examples of the comparator are omitted in this disclosure.

The phase comparator 60B does not have a function of detecting a frequency difference in an out-of-synchronization state, and exclusively generates an output signal having a value in accordance with a phase difference between two inputs thereof. Though this type of comparator cannot generate an output signal having a value for pull-in the frequency during the out-of-synchronization state, it can faithfully generate an output signal having a value in accordance with a phase difference between the two inputs even if the duty ratios of the input pulses vary during a synchronized state. This comparator is therefore suitable for a random data input in the synchronized state. Since this type of comparator is also known in terms of the configuration and techniques, specific examples thereof are omitted in this disclosure.

Figure 2:
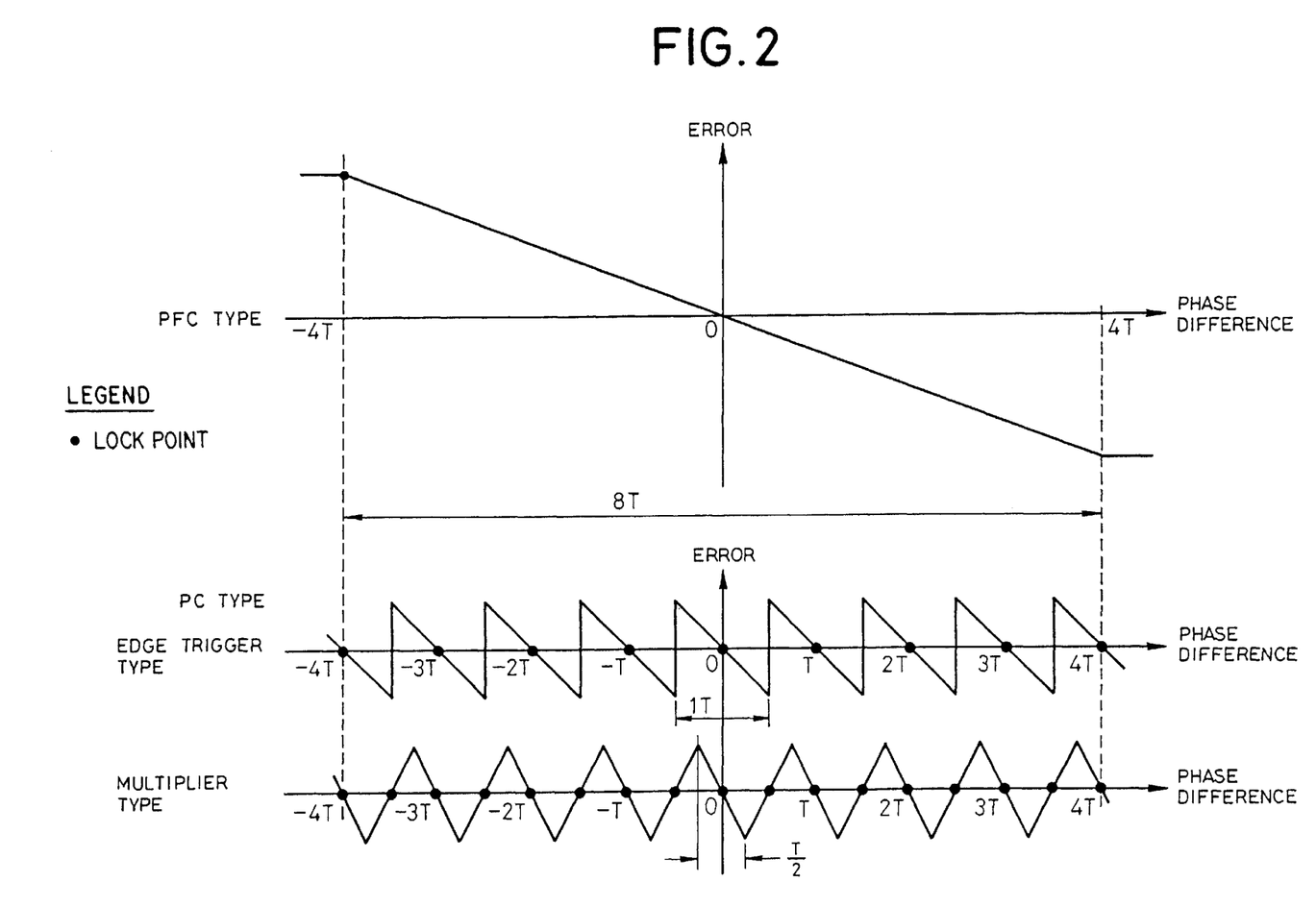
FIG. 2 is a graph representing phase comparison characteristics of a phase frequency comparator (PFC) and a phase comparator (PC) applied to the PLL of FIG. 1.

FIG. 2 represents the phase comparison characteristics of these comparators. Specifically, FIG. 2 illustrates respective relationships between a phase difference between two inputs and error generated corresponding thereto based on a bit interval T of a read signal for the two types of comparators.

The former phase frequency comparator (PFC type) causes an error to change with a single slope over a range from a phase difference −4 T to a phase difference +4 T, during which the error presents a zero value only at a point where the phase difference is zero. Therefore, the phase frequency comparator has a single lock point.

An edge trigger type phase comparator, which is one of the latter phase comparators (PC type) has eight periods over the range between the phase differences −4 T and +4 T, where an error changes with a single slope in each of the eight periods. Thus, the error presents a zero value not only at the point where the phase difference is zero but at points where the phase differences are ±4 T, ±3 T, ±2 T, and ±T, respectively. The comparator therefore has nine lock points. A multiplier type comparator, also belonging to the latter phase comparators has 16 of such periods, and an error presents zero not only at ±4 T, ±3 T, ±2 T, ±T, and zero of phase differences but also at ±0.5 T, ±1.5 T, ±2.5 T, and ±3.5 T of phase differences, respectively. The multiplier type comparator therefore has 17 lock points.

It will be understood from the foregoing that the PC type comparator is likely to output zero as an error not only when the phase difference is zero but also when the phase difference presents other values. If the PLL is locked at a phase difference other than zero, a miss lock (side lock) will occur. On the other hand, the PFC type comparator does not give rise to such a miss lock since it outputs an error corresponding to a wide range of phase difference centered at the point where the phase difference is zero.

As understood from the foregoing, the PFC type has a wide dynamic range extending over 8 T of phase difference from −4 T to +4 T, whereas the PC type merely has a dynamic range one eighth or less as much as that of the PFC type. Specifically, the edge trigger type has a dynamic range over 1 T from −T/2 to +T/2, and the multiplier type has a dynamic range over 0.5 T from −T/4 to +T/4.

In addition, good results are obtained when the phase comparison sensitivities of the two types of comparators are designed to be equivalent to each other (when loop filters (LPF) having the same characteristics are used on condition that the frequency characteristic of the PLL is constant).

Turning back to FIG. 1, output signals of the two comparators are supplied to a selector 61. The selector 61 outputs one of the input signals thereof in accordance with a control signal, later described, and supplies a selected signal to a first loop filter (LPF) 62A and to a second loop filter (LPF) 62B.

The LPF 62A, which is a loop filter associated with the phase frequency comparator 60A, has characteristics of wide pass band and high gain. The LPF 62B, which is a loop filter associated with the phase comparator 60B, has characteristics of narrow pass band and low gain characteristics. Specific characteristics of these LPFs are illustrated in FIG. 3.

Figure 3:
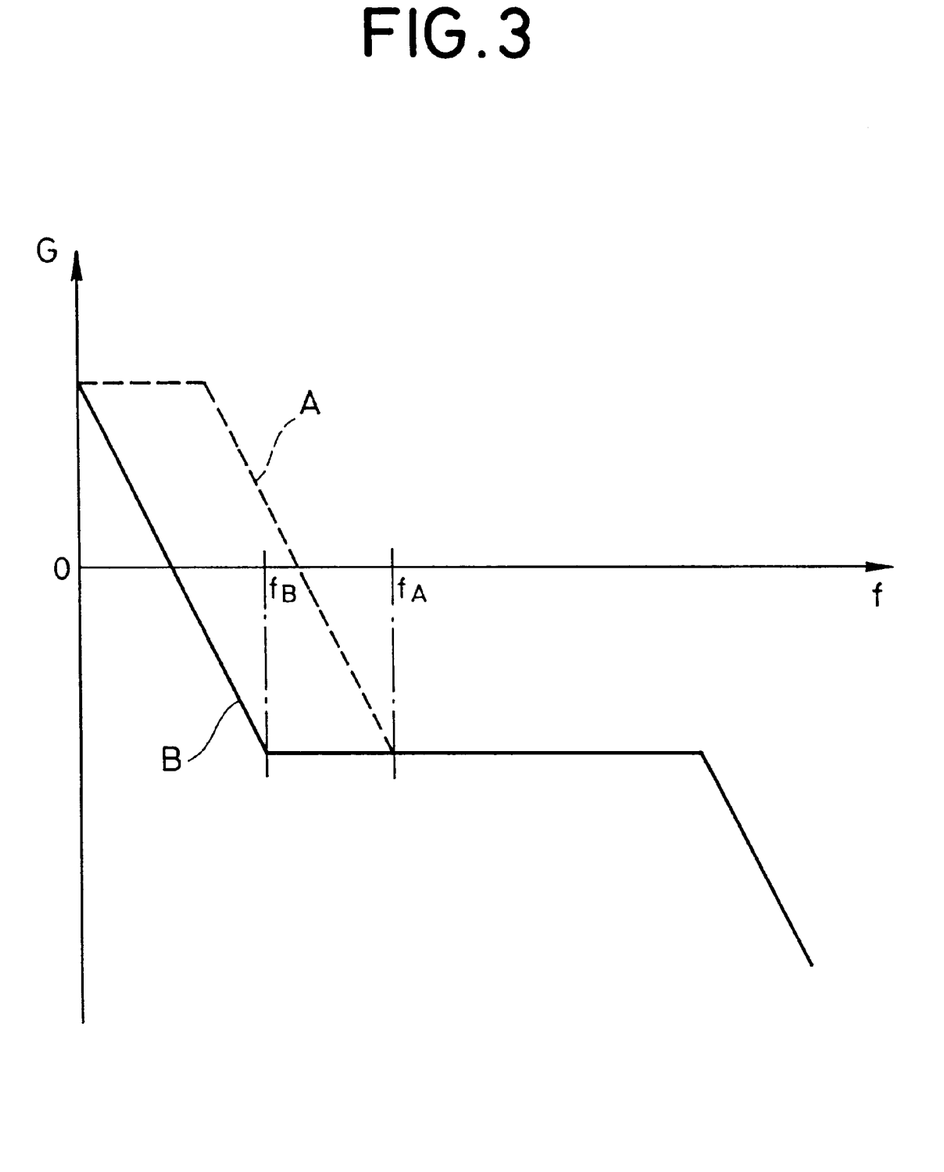
FIG. 3 is a graph representing frequency characteristics of two loop filters applied to the PLL of FIG. 1.

In FIG. 3, the abscissa f represents the frequency, while the ordinate G represents the gain. While the LPF 62B exhibits a low pass characteristic as represented by a solid line B, the LPF 62A exhibits a low pass characteristic having a wider range than the LPF 62B, as represented by a broken line A. Stated another way, a bending frequency fA on a low boost gain of the LPF 62A is set higher than a bending frequency fB on a low boost gain of the LPF 62B. Thus, the gain of the LPF 62A is higher than that of the LPF 62B in a low frequency band.

Output signals of these LPFs are supplied to a selector 63. The selector 63 outputs one of input signals supplied thereto in accordance with a control signal, later described, and supplies the selected signal to a voltage controlled oscillator (hereinafter called the "VCO") 64 serving as a variable frequency generating means. The VCO 64 is capable of varying its oscillating frequency in accordance with an input signal, and supplies an oscillating signal to the outside of the PLL circuit 6 as a reproduced clock, directly to the phase comparator 60B as a signal to be compared, and to the phase frequency comparator 60A through the frequency divider 65.

The control signals supplied to the selectors 3, 61, 63 are generated by a control circuit 7. The control circuit 7 determines the timing for switching a selected output for each of the selectors based on a digitized read signal from the ATC circuit 2, and generates the control signals for instructing the selectors of input signals to be selectively output. The control signals and associated operations will be described later in greater detail.

The output read signal from the ATC circuit 2 is also supplied to a decoder 8. The decoder 8 is also supplied with the reproduced clock signal generated by the PLL circuit 6 such that the decoder 8 decodes the read signal based on the reproduced clock signal, and outputs data resulting from the decoding as reproduced data. The reproduced data is sent to a data processing system, not shown, where the reproduced data is subjected to image and/or audio reproduction processing, by way of example.

The basic operation of the foregoing configuration can be described with reference to FIG. 4.

On a DVD-RAM type disc or the like included as media to be read by the present apparatus, composite data are recorded in the form of a track. A recording data format for such discs is defined in units of a data block which includes, for example, a VFO at the beginning, an address field, a GAP/GUARD field, a VFO, and a data field in this order, followed by a GUARD/BUFF field at the end of the block. Such data blocks are sequentially arranged to form tracks. In the data field, single or mixed data including image, audio, and computer data, and other main information can be partially written. In FIG. 4, a portion of the data field into which the information has been written is indicated by hatching, while a portion of the data field into which no information has been written is represented by blanks. Two VFO fields, two address fields, and a GAP/GUARD field near the beginning have been previously recorded in an emboss data area of the disc, wherein individual data are recorded in the form of pit. The data field and the preceding VFO field are allocated in a user data area of the disc, and take the form of unmarked lands or grooves if no data has been written thereinto.

Figure 4:
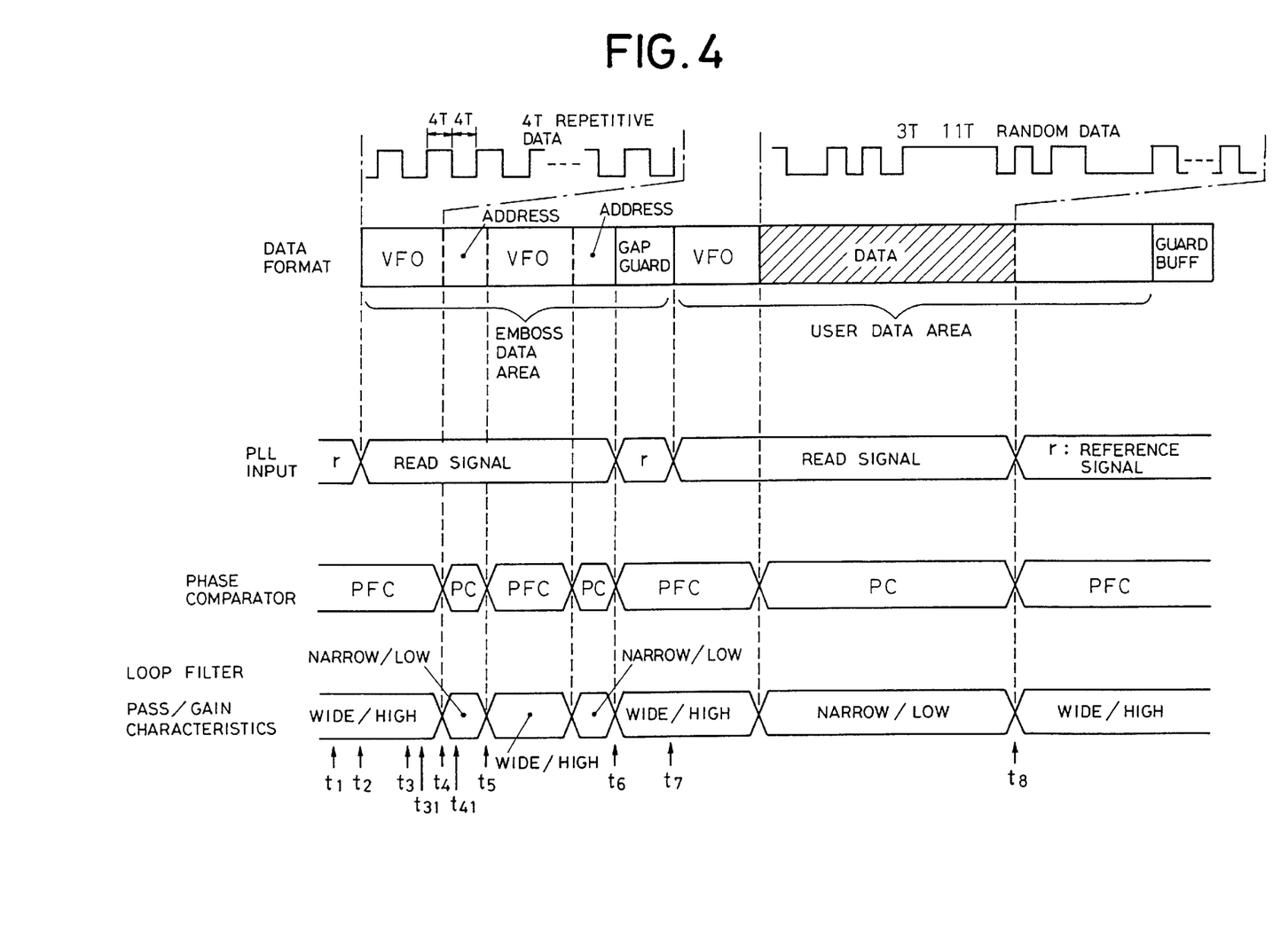
FIG. 4 is a time chart illustrating a format of data retrieved from a disc to be read by the disc player of FIG. 1 and a manner of PLL control corresponding thereto.

As schematically illustrated in an upper portion of FIG. 4, each VFO is a repetitive data which carries a pulse train successively alternating high and low levels with a definite half period of 4 T length, whereas written into the address field and the data field is random data which carries a train of pulses having pulse widths varying in a range of 3 T to 11 T.

Thus, as described previously, the phase frequency comparator 60A suitable for repetitive data is used as an error generating means in the PLL during the VFO is being read, while the phase comparator 60B suitable for random data is used as an error generating means in the PLL during written portions of the address field and the data field are being read, thereby making it possible to allow the PLL to correctly follow up the read signal in both reading situations. Particularly, during the VFO is being read, the phase frequency comparator 60A having a wide dynamic range and operating at a single lock point will never give rise to a miss lock, thereby making it possible to achieve a reliable pulling-in operation even if the VFO is short.

Also, as a more preferable aspect, a wide pass band/high gain LPF is selected to allow for a rapid PLL's pulling-in operation when the VFO is being read, while a narrow pass band/low gain LPF is selected to provide higher immunity to drop-out and noise when random data is being read, thus making it possible to provide a more correct follow-up operation. It should be noted that the present embodiment does realize such control.

Next, the above-mentioned operation will be described in greater detail.

Figure 5:
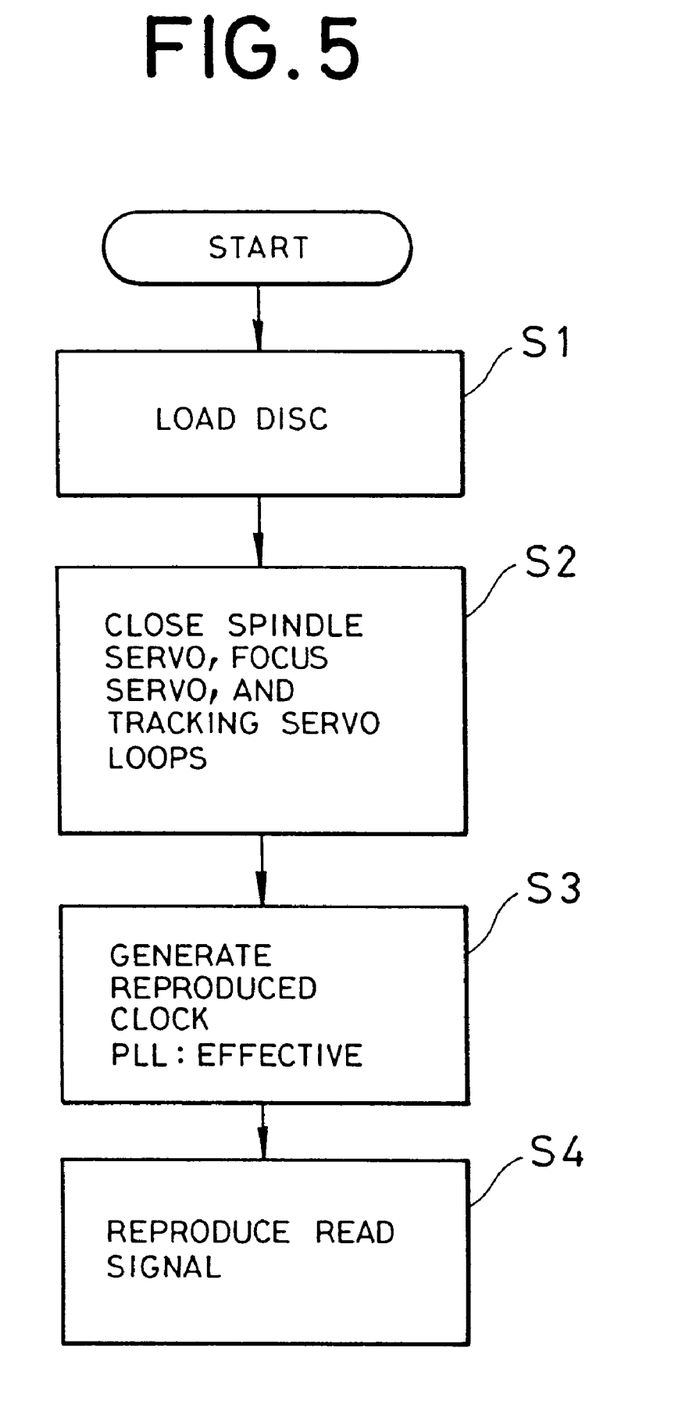
FIG. 5 is a flow chart showing the positioning of a process for generating a reproduced or regenerative clock signal in a flow of the overall operation, from an initial stage, performed by the disc player illustrated in FIG. 1.

It will be helpful to first clarify where the processing for generating a reproduced clock signal is positioned within an overall flow of the operation, from an initial stage thereof, performed by the disc player. FIG. 5 shows the positioning of the processing, where the player recognizes that a disc has been loaded therein (step S1), and turns on a spindle servo for controlling the rotation of the disc, a focus servo for controlling the focus of a pickup on a recording surface of the disc, and a tracking servo for controlling the tracking of the pickup with respect to a recording track of the disc (step S2).

When the respective main servos are turned on and locked as mentioned above, a predetermined reading state is held, and the PLL circuit 6 becomes effective (step S3). The PLL circuit 6 follows up a read signal supplied thereto to generate a reproduced clock. When a final lock detection is made, the player determines that reliable decoding (or demodulation) can be performed, and starts reproducing the read signal (step S4).

It should be noted that while step S3 is executed after the respective main servos have turned on, the follow-up operation of the PLL is continuously performed during the reproduction at step S4.

Figure 6:
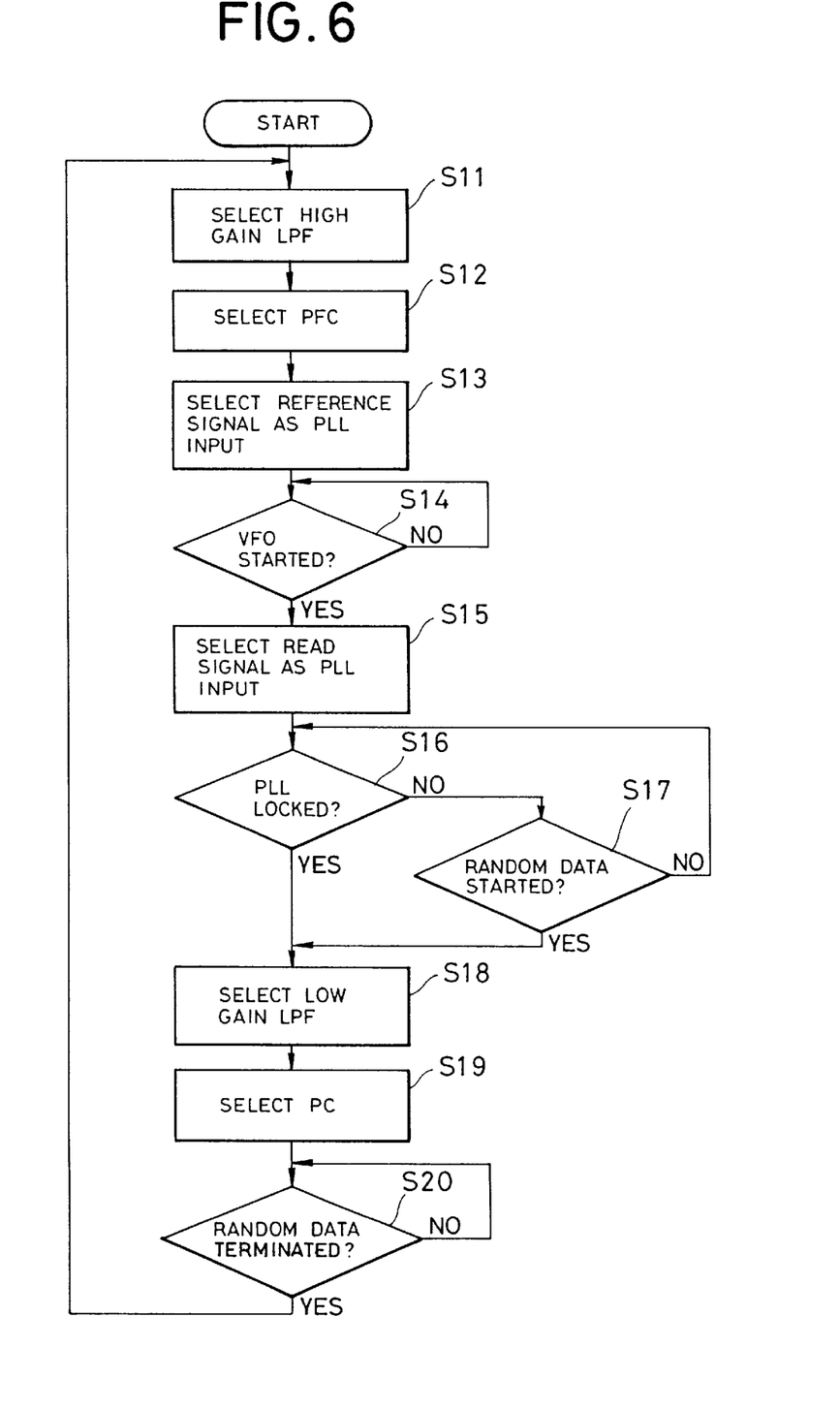
FIG. 6 is a flow chart representing a processing procedure of a PLL control executed by a control unit in the disc player of FIG. 1.

FIG. 6 represents in a flow chart form an outline of the processing executed by the control circuit 7 illustrated in FIG. 1, and is referred to in the following description together with the time chart of FIG. 4.

In FIG. 6, the control circuit 7 generates a control signal for instructing the selector 63 to selectively output an output signal of the wide pass band/high gain LPF 62A to the VCO 64 (step S1), and generates a control signal for instructing the selector 61 to selectively output an output signal of the phase frequency comparator 60A to the LPF 62A (step S12). Further, the control circuit 7 generates a control signal for instructing the selector 3 to selectively output a reference signal r from the frequency divider 5 to the phase frequency comparator 60A through the both edges detector 66 (step S13). This processing corresponds to a state at time t1 in FIG. 4. This state corresponds to a state in which a PLL is formed of the phase frequency comparator 60A, the wide pass band/high gain LPF 62A, and the VCO 64, with the reference signal r input to the PLL circuit 6, wherein the VCO 64 is set to an initial oscillating frequency corresponding to the reference signal r.

Since the reference signal r also has a repetitive data pattern, the PLL is formed of the phase frequency comparator 60A suitable for this type of signal and the wide pass band/high gain LPF 62A, whereby the PLL circuit 6 is rapidly pulled-in to the reference signal r in frequency. It should be noted that the reference signal r has a frequency substantially corresponding to the VFO and carries similar repetitive data.

Next, the control circuit 7 monitors the VFO in the read signal (step S14), and switches the PLL's input to the read signal when the arrival of the VFO is detected (step S15). This operation is carried out by the control circuit 7 which supplies the selector 3 with a control signal for instructing the same to selectively output a digitized read signal from the ATC circuit 2 to the phase frequency comparator 60A through the both edges detector 66, and corresponds to a state at time t2 in FIG. 4. In this state, a PLL is formed of the phase frequency comparator 60A, the wide pass band/high gain LPF 62A, and the VCO 64, with the read signal input to the PLL circuit 6, wherein the VCO 64 starts to control the oscillating frequency to a value corresponding to the VFO.

After time t2, the control circuit 7 monitors detection of locked PLL and arrival of random data (steps S16, S17). Specifically, the control circuit 7, after starting to control the PLL to follow up the VFO, determines whether or not the PLL has been locked to the VFO, and if not, also determines whether or not random data has arrived based on the read signal. As to the detection of the locked PLL, known techniques may be applied thereto, so that explanation thereof is omitted. As an alternative to the detection of the locked PLL, the lapse of a predetermined time from time t2 may be detected and regarded as the detection of the locked PLL. The PLL formed herein for following up the VFO is generally designed to be locked sufficiently before the VFO is terminated, so that the PLL is locked in the middle of the VFO, causing the processing flow to proceed from step S16 to step S18. The time at which the lock is detected in this case corresponds, for example, to time t3 in FIG. 4.

Unlike the foregoing condition, if the PLL cannot be locked even after the VFO has passed, the beginning of random data (address field or data field) subsequent to the VFO is detected at step S17, causing the processing flow to proceed from step S17 to step S18. The time at which the random data is detected in this case corresponds to time t4 in FIG. 4.

Since the VFO has a repetitive data pattern as mentioned already, the PLL is formed of the phase frequency comparator 60A and the wide pass band/high gain LPF 62A respectively suitable for such a VFO, whereby the PLL circuit 6 is rapidly pulled-in from an initial controlled state based on the reference signal r to a frequency corresponding to the VFO.

In a state in which the PLL is locked while it is supplied with repetitive data having a period of 8 T as the VFO or the reference signal r, the repetitive data is converted to repetitive data having a period of 4 T by the both edges detector 66 before it is supplied to the phase frequency comparator 60A, so that the VCO 64 generates a signal having a period of approximately 4 T/N.

As the processing flow proceeds to step S18, the control circuit 17 generates a control signal for instructing the selector 63 to selectively output an output signal of the narrow pass band/low gain LPF 62B to the VCO 64, and then generates a control signal for instructing the selector 61 to selectively output an output signal of the phase comparator 60B to the LPF 62B (step S19). This results in forming a PLL of the phase comparator 60B, the narrow pass band/low gain LPF 62B, and the VCO 64, with the read signal being input thereto, so that the VCO 64 starts to control the oscillating frequency to a value corresponding to the random data. Here, the switching to the phase comparator 60B at step S19 is performed after a predetermined time following the completion of the switching to the narrow pass band/low gain LPF 62B at step S18. This is because the switching to the phase comparator 60B causes abrupt fluctuations (shock) to the PLL in terms of control or servo. More specifically, the switching of the selector 61 causes noise to be introduced into the error signal supplied to the LPF, and a low frequency component of the introduced noise is amplified by the LPF, if it is a wide pass band/high gain LPF. If the error signal including the amplified low frequency noise component is supplied to the VCO 64, the VCO 64 can not perform a smooth follow-up operation. The processing at step S18 is intended to prevent such inconvenience. Stated another way, the switching to the narrow pass band/low gain LPF 62B at step S18, far prior to the processing at step S19, is provided for reducing the shock mentioned above for preparation of the subsequent control for the PLL to follow up the random data.

It should be noted that since the phase comparator 60B generates output pulses immediately after the occurrence of an edge of the waveform presented by the read VFO, the switching to the phase comparator 60B is preferably performed immediately before the occurrence of the edge at which time the phase comparator 60B has not generated output pulses.

In the flow proceeding from step S16 to step S19 through step S18, the time at which the switching to the narrow pass band/low gain LPF 62B is performed at step S18 substantially corresponds to time t3 in FIG. 4, and the time at which the switching to the phase comparator 60B is performed at step S19 substantially corresponds to time t31 in FIG. 4. On the other hand, in the flow proceeding from step S17 to step S19 through step S18, the time at which the switching to the narrow pass band/low gain LPF 62B is performed at step S18 substantially corresponds to time t4 in FIG. 4, and the time at which the switching to the phase comparator 60B is performed at step S19 substantially corresponds to time t41 in FIG. 4.

In this way, subsequent to time t31 or time t41, the PLL for random data is completely formed using the phase comparator 60B and the narrow pass band/low gain LPF 62B suitable for the random data, wherein the PLL circuit 6 is switched from the control corresponding to the VFO to the phase synchronization control for random data.

During the phase synchronization control for random data, the control circuit 7 monitors the random data for its end based on the read signal (step S20), and the processing flow proceeds to step S11 when the control circuit 7 determines that the random data has been completed. The time at which this determination is made corresponds to time t5 in FIG. 4.

As can be seen from FIG. 4, the VFO is derived from the read signal immediately after time t5. Therefore, even if the input to the PLL is switched to the reference signal r at step S13 after executing steps S11, S12, the front end of the VFO is immediately detected at step S14, and then the read signal is again input to the PLL at step S15. Subsequently, the processing at steps S15 to S20 as described above, i.e., the control for forcing the PLL to follow up the VFO and random data (address field) is sequentially performed. Thus, from time t5 to time t6 shown in FIG. 4, a control substantially equivalent to the control from time t2 to time t5 is performed.

Immediately after the processing flow proceeds to step S11 at time t6, a signal corresponding to the GAP/GUARD field is derived from the read signal. The GAP/GUARD field has a function of indicating a delimiter between an emboss data area and a user data area of the disc, and a recording surface associated with the GAP/GUARD field generally forms a peculiar recording state such as a mirror-finished surface having no pit. Since no VFO is of course detected from the read signal in this event, a PLL for the reference signal r is formed at steps S11, S12 and S13, and then the corresponding processing flow remains in waiting state for the VFO at step S14 for a while. Upon detecting the beginning of the VFO at step S14 after the GAP/GUARD field is terminated, the processing flow proceeds to step S15, the timing of which corresponds to time t7 in FIG. 4.

Subsequent to time t7, the PLL control at steps S15 to S20 is again performed in sequence for forcing the PLL to follow up the VFO and the random data (data field).

It should be noted however that since step S20 does not have a process of monitoring the last end of the data field's area but have a process of monitoring the last end of the random data having been actually written in the data field, the processing flow proceeds to step S11 at time t8, as will be apparent from FIG. 4.

Immediately after time t8, a signal corresponding to an unwritten portion of the data field having no written data is produced from the read signal. Generally, the unwritten portion as well as a subsequent GUARD/BUFFER field presents a peculiar state without marks or pits. Accordingly, since no VFO is detected from the read signal in the unwritten portion and GUARD/BUFFER field, the PLL for the reference signal r is formed by steps S11, S12, S13, and then the waiting state for VFO at step S14 will continue for a while.

Thus, the PLL circuit 6 is controlled for each data block as described above.

While in the foregoing embodiment, the PLL is controlled based on data in the format as illustrated in FIG. 4, the present invention may be applied to formats other than the illustrated one. Specifically, as long as a data format includes repetitive data and random data arranged in time series, a PLL can be formed of a suitable phase comparing means corresponding to the respective data, thereby providing advantages inherent in the present invention. The present invention, therefore, is not limited to particular DVD-RAM.

Also, while the foregoing embodiment has shown the configuration which includes two loop filters having different characteristics from each other and in which the filters are switched in accordance with the type of data, a single filter circuit only may be used with the circuit constants being switched in accordance with the type of data. Further, similar unification of the configuration may be applied to other blocks constituting the PLL in addition to the loop filters. Furthermore, while the foregoing embodiment has been described on the assumption that an analog PLL is made, the present invention can also be applied to a digital PLL.

Although the foregoing embodiment has been limitatively described in several aspects in addition to those pointed out above, modifications may be made to the present invention as required within a scope of designs possible for those skilled in the art.

As described above, the PLL circuit according to the present invention is capable of reliably PLL-locking even with a short VFO field to correctly enable subsequent reproduction of information data.

What is claimed is:

1. A PLL circuit supplied with a composite signal read from a recording medium in a format which includes a repetitive signal including a pulse train of a substantially constant duty ratio and a random signal including a pulse train having a format allowing variations in duty ratio, said repetitive signal and said random signal arranged essentially in time series, said PLL circuit comprising:

variable oscillating means for generating an output signal having a frequency according to a control voltage indicator;

phase frequency comparing means for comparing a read repetitive signal with said output signal in terms of phase and frequency to generate a phase frequency error signal;

phase comparing means for comparing a read random signal with said output signal in terms of phase to generate a phase error signal; and a loop filter for filtering said phase frequency error signal to extract a wide band component when a read signal is a repetitive signal and filtering said chase error signal to extract a narrow band component when a read signal is a random signal, to generate said control voltage indicator.

2. A PLL circuit supplied with a composite signal read from a recording medium in a format which includes a repetitive signal including a pulse train of a substantially constant duty ratio and a random signal including a pulse train having a format allowing variations in duty ratio, said repetitive signal and said random signal arranged essentially in time series, said PLL circuit comprising:

variable oscillating means for generating an output signal having a frequency according to a control voltage indicator;

phase frequency comparing means for comparing a read composite signal with said output signal in terms of phase and frequency to generate a phase frequency error signal;

phase comparing means for comparing a read composite signal with said output signal in terms of phase to generate a phase error signal;

loop filter means for extracting predetermined band components from said phase frequency error signal or said phase error signal to generate said control voltage indicator; and control means for forming one of a first phase synchronization loop including said phase frequency comparing means substantially in response to said repetitive signal produced from said composite signal, and a second phase synchronization loop including said phase comparing means, substantially in response to said random signal produced from said composite signal, based on a read composite signal.

3. A PLL circuit according to claim 2, wherein said control means controls said loop filter means such that said loop filter means exhibits a wide pass band characteristic when said first phase synchronization loop is formed and a narrow pass band characteristic when said second phase synchronization loop is formed.

4. A PLL circuit according to claim 2, wherein said control means controls said loop filter means such that said loop filter means exhibits a high gain characteristic when said first phase synchronization loop is formed and a low gain characteristic when said second phase synchronization loop is formed.

5. A PLL circuit according to claim 2, further comprising signal generating means for generating a pseudo signal in place of said composite signal, wherein said control means sets said pseudo signal to be supplied to said phase frequency comparing means and to said phase comparing means when neither said repetitive signal nor said random signal is produced from said composite signal.

6. A PLL circuit according to claim 5, wherein said pseudo signal is a signal equivalent to said repetitive signal, and said control means sets said pseudo signal to be supplied to said phase frequency comparing means when neither said repetitive signal nor said random signal is produced from said composite signal.

7. A PLL circuit according to claim 2, wherein timing at which said second phase synchronization loop is formed is before said random signal is produced from said composite signal.

8. A PLL circuit according to claim 2, wherein said composite signal is a read signal retrieved from a disc-shaped recording medium, and a clock for reproduction processing for said read signal is generated from the output signal of said variable oscillating means.

* * * * *